United States Patent
Hang et al.

(10) Patent No.: US 9,054,242 B2
(45) Date of Patent: *Jun. 9, 2015

(54) PROCESS FOR THE PRODUCTION OF A MWT SILICON SOLAR CELL

(75) Inventors: Kenneth Warren Hang, Hillsborough, NC (US); Giovanna Laudisio, Bristol (GB); Alistair Graeme Prince, Bristol (GB); Richard John Sheffield Young, Somerset (GB)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 1158 days.

This patent is subject to a terminal disclaimer.

(21) Appl. No.: 13/022,799

(22) Filed: Feb. 8, 2011

(65) Prior Publication Data

US 2011/0192456 A1 Aug. 11, 2011

Related U.S. Application Data

(60) Provisional application No. 61/302,245, filed on Feb. 8, 2010.

(51) Int. Cl.
   *H01L 31/0224* (2006.01)
   *H01L 31/18* (2006.01)
   *C03C 8/02* (2006.01)
   *C03C 8/10* (2006.01)
   *C03C 8/24* (2006.01)

(52) U.S. Cl.
   CPC ............ *H01L 31/02245* (2013.01); *C03C 8/02* (2013.01); *C03C 8/10* (2013.01); *C03C 8/24* (2013.01); *Y02E 10/50* (2013.01)

(58) Field of Classification Search
   CPC .................................................. H01I 31/02245
   See application file for complete search history.

(56) References Cited

U.S. PATENT DOCUMENTS

| 8,227,292 B2 * | 7/2012 | Hang et al. ...................... 438/98 |
| 2005/0176164 A1 | 8/2005 | Gee et al. |
| 2006/0060238 A1 * | 3/2006 | Hacke et al. .................. 136/256 |
| 2006/0273287 A1 | 12/2006 | Young et al. |
| 2010/0243040 A1 * | 9/2010 | Kim ............................. 136/255 |

FOREIGN PATENT DOCUMENTS

| WO | 2006/029250 A2 | 3/2006 |
| WO | 2009/067005 A1 | 5/2009 |

OTHER PUBLICATIONS

PCT International Search Report and Written Opinion mailed Jul. 10, 2012.
Clement et al., "Industrially feasible multi-crystalline metal wrap through (MWT) silicon solar cells exceeding 16% efficiency", Solar Energy Materials & Solar Cells, 2009, pp. 1051-1055, vol. 93.
Preliminary Datasheet Sunweb by Solland Solar.

* cited by examiner

*Primary Examiner* — Seahvosh Nikmanesh

(57) ABSTRACT

A process for the production of a MWT silicon solar cell comprising the steps:
(1) providing an n-type silicon wafer with (i) holes forming vias between the front-side and the back-side of the wafer and (ii) a p-type emitter extending over the entire front-side and the inside of the holes,
(2) applying a conductive metal paste to the holes of the silicon wafer to provide at least the inside of the holes with a metallization,
(3) drying the applied conductive metal paste, and
(4) firing the dried conductive metal paste, whereby the wafer reaches a peak temperature of 700 to 900° C.,
wherein the conductive metal paste has no or only poor firethrough capability and comprises (a) at least one particulate electrically conductive metal selected from the group consisting of silver, copper and nickel, (b) at least one particulate p-type dopant, and (c) an organic vehicle.

14 Claims, No Drawings

PROCESS FOR THE PRODUCTION OF A MWT SILICON SOLAR CELL

FIELD OF THE INVENTION

The present invention is directed to a process for the production of a MWT (metal-wrap-through) silicon solar cell having an n-type silicon base. The present invention is also directed to the respective MWT silicon solar cells.

TECHNICAL BACKGROUND OF THE INVENTION

The majority of the solar cells currently produced are based upon crystalline silicon.

A conventional solar cell with a p-type (p-doped) silicon base has an n-type (n-doped) emitter in the form of an n-type diffusion layer on its front-side. Such conventional silicon solar cell structure uses a negative electrode to contact the front-side or sun side of the cell, and a positive electrode on the back-side. It is well known that radiation of an appropriate wavelength falling on a p-n junction of a semiconductor body serves as a source of external energy to generate electron-hole pairs in that body. The potential difference that exists at a p-n junction, causes holes and electrons to move across the junction in opposite directions, thereby giving rise to flow of an electric current that is capable of delivering power to an external circuit. Most solar cells are in the form of a silicon wafer that has been metallized, i.e., provided with metal contacts which are electrically conductive. Typically, the front-side metallization is in the form of a so-called H pattern, i.e. in the form of a silver grid cathode comprising thin parallel finger lines (collector lines) and busbars intersecting the finger lines at right angle, whereas the back-side metallization is an aluminum anode in electric connection with silver or silver/aluminum busbars or tabs. The photoelectric current is collected from the front-side busbars and the back-side busbars or tabs.

Alternatively, a reverse solar cell structure with an n-type silicon base is also known. Such cells have a front p-type silicon surface (front p-type emitter) with a positive electrode on the front-side and a negative electrode to contact the back-side of the cell. Solar cells with n-type silicon bases (n-type silicon solar cells) can in theory produce absolute efficiency gains of up to 1% compared to solar cells with p-type silicon bases owing to the reduced recombination velocity of electrons in the n-doped silicon.

MWT silicon solar cells are examples of silicon solar cells having another cell design than the silicon solar cells described above. MWT silicon solar cells are well-known to the skilled person (cf. for example, the website "http://www-.sollandsolar.com/IManager/Content/4680/qfl7/mt1537/mi3099 4/mu1254913665/mv2341" and the leaflet "Preliminary Datasheet Sunweb" which can be downloaded from that website and F. Clement et al., "Industrially feasible multicrystalline metal wrap through (MWT) silicon solar cells exceeding 16% efficiency", Solar Energy Materials & Solar Cells 93 (2009), pages 1051-1055). MWT silicon solar cells represent a special type of silicon solar cells; they are back contact cells allowing for less front-side shadowing than standard silicon solar cells.

Just like in case of the standard silicon solar cells mentioned above, MWT silicon solar cells can be produced as MWT silicon solar cells having a p-type silicon base or, in the alternative, as MWT silicon solar cells having an n-type silicon base.

The silicon wafers of MWT silicon solar cells with an n-type silicon base are provided with small holes forming vias between the front- and the back-side of the cell. MWT silicon solar cells having an n-type silicon base have a p-type emitter extending over the entire front-side and the inside of the holes. The p-type emitter is covered with a dielectric passivation layer which serves as an ARC (antireflective coating) layer, as is conventional for silicon solar cells. Whereas the p-type emitter extends not only over the entire front-side but also over the inside of the holes, the dielectric passivation layer does not and leaves out the inside of the holes and, optionally, also a narrow rim around the front-edges of the holes. The inside of the holes and, if present, the narrow rim around the front-edges of the holes, i.e. the p-type diffusion layer not covered with the dielectric passivation layer, is provided with a metallization either in the form of a conductive metal layer (open hole) or in the form of a conductive metal plug (hole filled with conductive metal). The metallizations of the holes are typically applied from one or two conductive metal pastes and fired. To avoid misunderstandings, if two different conductive metal pastes are used, they are not applied so as to form a double-layer metallization; rather, one conductive metal paste is applied to the holes from the front-side thereof and the other from the back-side. The metallizations of the holes serve as emitter contacts and form anodic back contacts of the MWT silicon solar cell. In addition, the front-side of the MWT silicon solar cell is provided with a front-side metallization in the form of thin conductive metal collector lines which are arranged in a pattern typical for MWT silicon solar cells, for-example, in a grid- or web-like pattern or as thin parallel finger lines. The term "pattern typical for MWT silicon solar cells" means that the terminals of the collector lines overlap with the metallizations of the holes and are thus electrically connected therewith. The collector lines are applied from a conductive metal paste having fire-through capability. After drying the collector lines so applied they are fired through the front-side dielectric passivation layer thus making contact with the front surface of the silicon substrate.

The term "metal paste having fire-through capability" used in the description and the claims means a metal paste which etches and penetrates through (fires through) a passivation or ARC layer during firing thus making electrical contact with the surface of the silicon substrate. It is also true, that a metal paste having poor or even no fire-through capability behaves contrarily; it does not fire through a passivation or ARC layer and makes no electrical contact with the silicon substrate upon firing. To avoid misunderstandings; in this context the term "no electrical contact" shall not be understood absolute; rather, it shall mean that the contact resistivity between fired metal paste and silicon surface exceeds 1 $\Omega \cdot cm^2$, whereas, in case of electrical contact, the contact resistivity between fired metal paste and silicon surface is in the range of 1 to 10 $m\Omega \cdot cm^2$.

The contact resistivity can be measured by TLM (transfer length method). To this end, the following procedure of sample preparation and measurement may be used: A silicon wafer having an ARC or passivation layer (for example, a 75 nm thick $SiN_x$ layer) is screen printed on that layer with the silver paste to be tested in a pattern of parallel lines (for example, 127 μm wide and 6 μm thick lines with a spacing of 2.2 mm between the lines) and is then fired with the wafer reaching a peak temperature of, for example, 800° C. The fired wafer is laser-cutted into 10 mm by 28 mm long strips, where the parallel lines do not touch each other and at least 6 lines are included. The strips are then subject to conventional TLM measurement at 20° C. in the dark. The TLM measurement can be carried out using the device GP 4-Test Pro from GP Solar.

The back-side of a MWT silicon solar cell having an n-type silicon base is provided with cathodic conductive metal collector back contacts, which are in any case electrically insulated from the metallizations of the holes. The photoelectric current is collected from the anodic back contacts and the cathodic conductive metal collector back contacts of the MWT silicon solar cell.

Similar to the production of a silicon solar cell of the reverse type mentioned above, the production of a MWT silicon solar cell having an n-type silicon base starts with the formation of an n-type silicon substrate in the form of a silicon wafer. To this end, an n-doped base is typically formed via thermal diffusion of a phosphorus containing precursor such as $POCl_3$ into the silicon wafer. Typically, the silicon wafers have a thickness in the range of, for example, 140 to 220 µm and an area in the range of, for example, 150 to 400 $cm^2$. Small holes forming vias between the front- and the back-side of the wafer are applied, typically by laser drilling. The holes so produced are, for example, 30 to 250 µm in diameter, and they are evenly distributed over the wafer. Their number lies in the range of, for example, 10 to 100 per wafer. The holes so produced are evenly distributed over the wafer and their number lies in the range of, for example, 10 to 100 per wafer. Then a p-type diffusion layer is formed, typically via thermal diffusion of a boron containing precursor such as $BBr_3$. The p-type diffusion layer is formed over the entire front-surface of the silicon substrate including the inside of the holes. The p-n junction is formed where the concentration of the n-type dopant equals the concentration of the p-type dopant. The cells having the p-n junction close to the sun side, have a junction depth between 50 and 500 nm. After formation of the diffusion layer, excess surface glass is removed from the emitter surface by etching, in particular, in a strong acid like, for example, hydrofluoric acid. Typically, a dielectric layer, for example, of $TiO_x$, $SiO_x$, $TiO_x/SiO_x$, $SiN_x$ or, in particular, a dielectric stack of $SiN_x/SiO_x$ is then formed on the front-side p-type diffusion layer leaving out however the inside of the holes and, optionally, also a narrow rim around the front-side edges of the holes. Deposition of the dielectric may be performed, for example, using a process such as plasma CVD (chemical vapor deposition) in the presence of hydrogen or sputtering. The dielectric layer serves as both an ARC and passivation layer for the front-side of the MWT silicon solar cell.

Just like a conventional solar cell structure with an n-type base, MWT silicon solar cells having an n-type base typically have a positive electrode on their front-side and a negative electrode on their back-side. The positive front electrode takes the form of thin conductive collector lines arranged in a pattern typical for MWT silicon solar cells. The thin conductive collector lines are typically applied by screen printing, drying and firing a front-side conductive metal paste (front electrode forming conductive metal paste) on the ARC layer on the front-side of the cell, whereby the terminals of the collector lines overlap with the metallizations of the holes to enable electric connection therewith. Firing is typically carried out in a belt furnace for a period of 1 to 5 minutes with the wafer reaching a peak temperature in the range of 700 to 900° C.

As already mentioned, the holes of the silicon wafers of the MWT silicon solar cells are provided with metallizations. To this end, the holes themselves are metallized by applying conductive metal paste to the holes, either in the form of a conductive metal layer (open holes) or in the form of conductive metal plugs (holes filled with conductive metal). The metallizations may cover only the inside of the holes or also a narrow rim around the edges of the holes, whereby the narrow rim may be present on the front-side edges of the holes, on the back-side edges of the holes or on both. The metallizations may be applied from one single conductive metal paste. It is also possible to apply the metallizations from two different conductive metal pastes, i.e. one conductive metal paste may be applied to the front-side of the holes and the other to their back-side. After application of the one or two conductive metal pastes it is/they are dried and fired to form emitter contacts and, respectively, anodic back contacts of the MWT silicon solar cell. Firing is typically carried out in a belt furnace for a period of 1 to 5 minutes with the wafer reaching a peak temperature in the range of 700 to 900° C. The fired metallizations of the holes are in electric connection with the terminals of the thin front-side conductive collector lines.

In addition, a back-side silver paste is applied, typically screen printed, and successively dried on the back-side of the n-type silicon substrate avoiding any contact with the metallizations of the holes. In other words, the back-side silver paste is applied ensuring that it stays electrically insulated from the metallizations of the holes prior to as well as after firing. The back-side silver paste is applied evenly distributed over the back-side of the n-type silicon substrate. The dried back-side silver paste is then transformed by firing to become evenly distributed cathodic silver back collector contacts. Firing is typically carried out in a belt furnace for a period of 1 to 5 minutes with the wafer reaching a peak temperature in the range of 700 to 900° C. The front anode, the metallizations of the holes and the back cathodes can be fired sequentially or cofired. The silver back collector contacts account only for a small area of the back-side of the n-type silicon substrate. In addition, the front-side conductive metal paste applied as thin collector lines fires through the ARC layer during firing, and is thereby able to electrically contact the front-side p-type emitter.

SUMMARY OF THE INVENTION

The present invention relates to a process for the production of a MWT silicon solar cell having an n-type silicon base. At the same time the process is a process for the production of anodic back contacts of such a MWT silicon solar cell. The process comprises the steps:
(1) providing an n-type silicon wafer with (i) holes forming vias between the front-side and the back-side of the wafer and (ii) a p-type emitter extending over the entire front-side and the inside of the holes,
(2) applying a conductive metal paste to the holes of the silicon wafer to provide at least the inside of the holes with a metallization,
(3) drying the applied conductive metal paste, and
(4) firing the dried conductive metal paste, whereby the wafer reaches a peak temperature of 700 to 900° C.,
wherein the conductive metal paste has no or only poor fire-through capability and comprises (a) at least one particulate electrically conductive metal selected from the group consisting of silver, copper and nickel, (b) at least one particulate p-type dopant, and (c) an organic vehicle, wherein the at least one particulate p-type dopant is selected from the group consisting of boron, aluminum and p-type silicon alloys selected from the group consisting of alloys comprising silicon and boron, alloys comprising silicon and aluminum and alloys comprising silicon, boron and aluminum. Accordingly, the present invention relates also to the so produced MWT silicon solar cells and, respectively, to the so-produced anodic back contacts thereof.

In the description and the claims the term "p-type silicon alloy" is used. It means a silicon alloy of the p-type, i.e. the proportion of boron and/or aluminum in such silicon alloy is sufficiently high to ensure the silicon alloy has a p-type character.

DETAILED DESCRIPTION OF THE INVENTION

The process of the present invention allows for the production of MWT silicon solar cells with improved electric efficiency. The fired conductive metal paste has a good ohmic contact with and adheres well to the holes, i.e. the p-type silicon emitter surface of the inside of the holes of the silicon wafer. Good adhesion is important with regard to a long service life of the MWT silicon solar cells.

Without being bound to theory it is believed that the conductive metal paste with its at best poor fire-through capability does not or not significantly damage the p-type emitter when steps (3) and (4) of the process of the present invention are carried out. It is important to avoid or reduce damage of the p-type emitter to avoid shunting characteristics.

In step (1) of the process of the present invention an n-type silicon wafer with (i) holes forming vias between the front-side and the back-side of the wafer and (ii) a p-type emitter extending over the entire front-side and the inside of the holes is provided. The silicon wafer is a mono or polycrystalline silicon wafer as is conventionally used for the production of silicon solar cells; it has both a p-type region and an n-type region, and a p-n junction. Typically, the silicon wafer has an ARC layer on its front-side, for example, of $TiO_x$, $SiO_x$, $TiO_x/SiO_x$, $SiN_x$ or, in particular, a dielectric stack of $SiN_x/SiO_x$. If such ARC layer is present, it leaves out the inside of the holes and, optionally, also a narrow rim around the edges of the holes. Such silicon wafers are well known to the skilled person; for brevity reasons reference is expressly made to the section "TECHNICAL BACKGROUND OF THE INVENTION". The silicon wafer may already be provided with the front-side conductive metal collector lines and/or with the cathodic silver back collector contacts, as described above in the section "TECHNICAL BACKGROUND OF THE INVENTION".

In step (2) of the process of the present invention a conductive metal paste having no or only poor fire-through capability and comprising (a) at least one particulate electrically conductive metal selected from the group consisting of silver, copper and nickel, (b) at least one particulate p-type dopant, and (c) an organic vehicle is applied to the holes of the silicon wafer in order to provide at least the inside of the holes with a metallization.

In a particular embodiment of the process of the present invention, the conductive metal paste comprises as component (d) at least one glass frit selected from the group consisting of (i) lead-free glass frits with a softening point temperature in the range of 550 to 611° C. and containing 11 to 33 wt. % (weight-%) of $SiO_2$, >0 to 7 wt. %, in particular, 5 to 6 wt. % of $Al_2O_3$ and 2 to 10 wt. % of $B_2O_3$ and (ii) lead-containing glass frits with a softening point temperature in the range of 571 to 636° C. and containing 53 to 57 wt. % of PbO, 25 to 29 wt. % of $SiO_2$, 2 to 6 wt. % of $Al_2O_3$ and 6 to 9 wt. % of $B_2O_3$.

In the description and the claims the term "softening point temperature" is used. It shall mean the glass transition temperature, determined by differential thermal analysis DTA at a heating rate of 10 K/min.

The conductive metal paste comprises at least one particulate electrically conductive metal selected from the group consisting of silver, copper and nickel. Preferably, the particulate electrically conductive metal is silver. The particulate silver may be comprised of silver or a silver alloy with one or more other metals like, for example, copper. In case of silver alloys the silver content is, for example, 99.7 to below 100 wt. %. The particulate electrically conductive metal or silver may be uncoated or at least partially coated with a surfactant. The surfactant may be selected from, but is not limited to, stearic acid, palmitic acid, lauric acid, oleic acid, capric acid, myristic acid and linolic acid and salts thereof, for example, ammonium, sodium or potassium salts.

The average particle size of the particulate electrically conductive metal or silver is in the range of, for example, 0.5 to 5 μm. The particulate electrically conductive metal or silver may be present in the conductive metal paste in a proportion of 50 to 92 wt. %, or, in an embodiment, 65 to 84 wt. %, based on total conductive metal paste composition.

In the present description and the claims the term "average particle size" is used. It shall mean the average particle size (mean particle diameter, d50) determined by means of laser scattering.

All statements made in the present description and the claims in relation to average particle sizes relate to average particle sizes of the relevant materials as are present in the conductive metal paste composition.

It is possible to replace a small proportion of the electrically conductive metal selected from the group consisting of silver, copper and nickel by one or more other particulate metals. The proportion of such other particulate metal(s) is, for example, 0 to 10 wt. %, based on the total of particulate metals contained in the conductive metal paste. It may in particular be expedient for the conductive metal paste to contain particulate iridium, particulate platinum and/or particulate palladium as particulate metal(s) replacing a small proportion of the electrically conductive metal. The particulate iridium, platinum and/or palladium may be contained in a total proportion of, for example, 0.5 to 5 wt. %, based on the total of particulate metals contained in the conductive metal paste.

The conductive metal paste comprises at least one particulate p-type dopant, wherein the at least one particulate p-type dopant is selected from the group consisting of boron, aluminum and p-type silicon alloys selected from the group consisting of alloys comprising silicon and boron, alloys comprising silicon and aluminum and alloys comprising silicon, boron and aluminum.

The average particle size of the at least one particulate p-type dopant is in the range of, for example, 0.5 to <10 μm. The total content of the at least one p-type dopant in the conductive metal paste is, for example, 0.5 to 10 wt.-%, or, in an embodiment, 1 to 5 wt.-%, or, in particular 1.5 to 3 wt.-%.

The p-type silicon alloys are selected from the group consisting of alloys comprising silicon and boron, alloys comprising silicon and aluminum and alloys comprising silicon, boron and aluminum. They comprise binary alloys of silicon with boron, binary alloys of silicon with aluminum, ternary alloys of silicon with aluminum and boron, alloys of silicon with boron and other chemical elements than aluminum, alloys of silicon with aluminum and other chemical elements than boron and alloys of silicon with aluminum, boron and other chemical elements than aluminum and boron. It is preferred to use powders of binary alloys of silicon with boron, of binary alloys of silicon with aluminum and/or of ternary alloys of silicon with aluminum and boron as particulate p-type silicon alloy. The binary alloys, in particular the binary alloys of silicon with aluminum are particularly preferred as p-type silicon alloy.

The silicon content in the p-type silicon alloys is in the range of, for example, 5 to 20 wt.-%. In case of the particularly preferred binary alloys of silicon with aluminum the silicon content is in the range of, for example, 10 to 15 wt.-%. The eutectic aluminum/silicon alloy (AlSi12) is most preferred.

The conductive metal paste comprises an organic vehicle. A wide variety of inert viscous materials can be used as organic vehicle. The organic vehicle may be one in which the particulate constituents (particulate metal, particulate p-type dopant, glass frit, further optionally present inorganic particulate constituents) are dispersible with an adequate degree of stability. The properties, in particular, the rheological properties, of the organic vehicle may be such that they lend good application properties to the conductive metal paste composition, including: stable dispersion of insoluble solids, appropriate viscosity and thixotropy for application, appropriate wettability of the paste solids, a good drying rate, and good firing properties. The organic vehicle used in the conductive metal paste may be a nonaqueous inert liquid. The organic vehicle may be an organic solvent or an organic solvent mixture; in an embodiment, the organic vehicle may be a solution of organic polymer(s) in organic solvent(s). In an embodiment, the polymer used for this purpose may be ethyl cellulose. Other examples of polymers which may be used alone or in combination include ethylhydroxyethyl cellulose, wood rosin, phenolic resins and poly(meth)acrylates of lower alcohols. Examples of suitable organic solvents comprise ester alcohols and terpenes such as alpha- or beta-terpineol or mixtures thereof with other solvents such as kerosene, dibutylphthalate, diethylene glycol butyl ether, diethylene glycol butyl ether acetate, hexylene glycol and high boiling alcohols. In addition, volatile organic solvents for promoting rapid hardening after application of the conductive metal paste in step (2) of the process of the present invention can be included in the organic vehicle. Various combinations of these and other solvents may be formulated to obtain the viscosity and volatility requirements desired.

The organic vehicle content in the conductive metal paste may be dependent on the method of applying the paste and the kind of organic vehicle used, and it can vary. In an embodiment, it may be from 10 to 45 wt. %, or, in an embodiment, it may be in the range of 12 to 35 wt. %, based on total conductive metal paste composition. The number of 10 to 45 wt. % includes organic solvent(s), possible organic polymer(s) and possible organic additive(s).

The organic solvent content in the conductive metal paste may be in the range of 5 to 25 wt. %, or, in an embodiment, 10 to 20 wt. %, based on total conductive metal paste composition.

The organic polymer(s) may be present in the organic vehicle in a proportion in the range of 0 to 20 wt. %, or, in an embodiment, 5 to 10 wt. %, based on total conductive metal paste composition.

In the particular embodiment of the process of the present invention, the conductive metal paste comprises at least one glass frit selected from the group consisting of (i) lead-free glass frits with a softening point temperature in the range of 550 to 611° C. and containing 11 to 33 wt. % of $SiO_2$, >0 to 7 wt. %, in particular, 5 to 6 wt. % of $Al_2O_3$ and 2 to 10 wt. % of $B_2O_3$ and (ii) lead-containing glass frits with a softening point temperature in the range of 571 to 636° C. and containing 53 to 57 wt. % of PbO, 25 to 29 wt. % of $SiO_2$, 2 to 6 wt. % of $Al_2O_3$ and 6 to 9 wt. % of $B_2O_3$.

In case of the lead-free glass frits of type (i), the weight percentages of $SiO_2$, $Al_2O_3$ and $B_2O_3$ do not total 100 wt.-% and the missing wt.-% are in particular contributed by one or more other oxides, for example, alkali metal oxides like $Na_2O$, alkaline earth metal oxides like MgO and metal oxides like $Bi_2O_3$, $TiO_2$ and ZnO.

The lead-free glass frits of type (i) may contain 40 to 73 wt.-%, in particular 48 to 73 wt.-% of $Bi_2O_3$. The weight percentages of $Bi_2O_3$, $SiO_2$, $Al_2O_3$ and $B_2O_3$ may or may not total 100 wt.-%. In case they do not total 100 wt.-% the missing wt.-% may in particular be contributed by one or more other oxides, for example, alkali metal oxides like $Na_2O$, alkaline earth metal oxides like MgO and metal oxides like $TiO_2$ and ZnO.

In case of the lead-containing glass frits of type (ii), the weight percentages of PbO, $SiO_2$, $Al_2O_3$ and $B_2O_3$ may or may not total 100 wt.-%. In case they do not total 100 wt.-% the missing wt.-% may in particular be contributed by one or more other oxides, for example, alkali metal oxides like $Na_2O$, alkaline earth metal oxides like MgO and metal oxides like $TiO_2$ and ZnO.

In case the conductive metal paste comprises lead-free glass frit of type (i) as well as lead-containing glass frit of type (ii), the ratio between both glass frit types may be any or, in other words, in the range of from >0 to infinity. Preferably, the conductive metal paste as used in the particular embodiment of the process of the present invention comprises no glass frit other than glass frit of type (i) and/or type (ii).

The one or more glass frits selected from the groups (i) and/or (ii) serve as inorganic binder. The average particle size of the glass frit(s) is in the range of, for example, 0.5 to 4 μm. The total content of glass frit selected from the groups (i) and/or (ii) in the conductive metal paste as used in the particular embodiment of the process of the present invention is, for example, 0.25 to 8 wt. %, or, in an embodiment, 0.8 to 3.5 wt. %.

The preparation of the glass frits is well known and consists, for example, in melting together the constituents of the glass, in particular in the form of the oxides of the constituents, and pouring such molten composition into water to form the frit. As is well known in the art, heating may be conducted to a peak temperature in the range of, for example, 1050 to 1250° C. and for a time such that the melt becomes entirely liquid and homogeneous, typically, 0.5 to 1.5 hours.

The glass may be milled in a ball mill with water or inert low viscosity, low boiling point organic liquid to reduce the particle size of the frit and to obtain a frit of substantially uniform size. It may then be settled in water or said organic liquid to separate fines and the supernatant fluid containing the fines may be removed. Other methods of classification may be used as well.

The conductive metal paste may comprise one or more organic additives, for example, surfactants, thickeners, rheology modifiers and stabilizers. The organic additive(s) may be part of the organic vehicle. However, it is also possible to add the organic additive(s) separately when preparing the conductive metal paste. The organic additive(s) may be present in the conductive metal paste in a total proportion of, for example, 0 to 10 wt. %, based on total conductive metal paste composition.

The conductive metal paste used in the process of the present invention is a viscous composition, which may be prepared by mechanically mixing the particulate metal, the particulate p-type dopant and the glass frit(s) with the organic vehicle. In an embodiment, the manufacturing method power mixing, a dispersion technique that is equivalent to the traditional roll milling, may be used; roll milling or other mixing technique can also be used.

The conductive metal paste can be used as such or may be diluted, for example, by the addition of additional organic solvent(s); accordingly, the weight percentage of all the other constituents of the conductive metal paste may be decreased.

The application viscosity of the conductive metal paste may be 20 to 350 Pa·s when it is measured at a spindle speed of 10 rpm and 25° C. by a utility cup using a Brookfield HBT viscometer and #14 spindle.

The conductive metal paste is applied to the holes of the silicon wafer to provide at least the inside of the holes with a metallization, i.e. to form the metallizations of at least the inside of the holes. The conductive metal paste may be applied in the form of a conductive metal layer (open hole) or in the form of a conductive metal plug (hole filled with conductive metal). The method of conductive metal paste application may be printing, for example, screen printing. The application may be performed from the front-side and/or from the back-side of the holes. The conductive metal paste is applied so as to cover at least the inside of the holes with a metallization; i.e. the conductive metal paste may be applied so as to cover only the inside of the holes or also a narrow rim around the edges of the holes, whereby the narrow rim may be present around the front-side edges of the holes, around the back-side edges of the holes or around both. It is possible to apply an additional second conductive metal paste other than the conductive metal paste applied in step (2) of the process of the present invention; in such case the metallizations of the holes are formed by applying one conductive metal paste from the front-side of the holes and the other from their back-side, wherein the metallization of the inside of the holes is applied from the conductive metal paste without or with only poor fire-through capability used in step (2) of the process of the present invention.

In step (3) of the process of the present invention the conductive metal paste applied in step (2) is dried, for example, for a period of 1 to 100 minutes with the silicon wafer reaching a peak temperature in the range of 100 to 300° C. Drying can be carried out making use of, for example, belt, rotary or stationary driers, in particular, IR (infrared) belt driers.

In step (4) of the process of the present invention the dried conductive metal paste is fired to form the finished metallizations of the holes. These metallizations serve as emitter contacts and anodic back contacts of the MWT silicon solar cell. The firing of step (4) may be performed, for example, for a period of 1 to 5 minutes with the silicon wafer reaching a peak temperature in the range of 700 to 900° C. The firing can be carried out making use of, for example, single or multi-zone belt furnaces, in particular, multi-zone IR belt furnaces. The firing may happen in an inert gas atmosphere or in the presence of oxygen, for example, in the presence of air. During firing the organic substance including non-volatile organic material and the organic portion not evaporated during the drying may be removed, i.e. burned and/or carbonized, in particular, burned. The organic substance removed during firing includes organic solvent(s), optionally present organic polymer(s) and optionally present organic additive (s). At least in case of the particular embodiment of the process of the present invention there is a further process taking place during firing, namely sintering of glass frit with the particulate electrically conductive metal.

Firing may be performed as so-called cofiring together with a front-side metallization in the form of thin conductive metal collector lines arranged in a pattern typical for MWT silicon solar cells and applied from a conductive metal paste and/or with silver back collector contacts applied from a back-side silver paste.

The following examples illustrate the determination of the fire-through capability of silver pastes. The examples show also how the adhesion between fired silver paste and n-type silicon substrate surface was tested, whereby the adhesion test was carried out making use of a conventional sample n-type silicon wafer, because it is not possible to test the adhesion between fired silver paste and the inside of the holes of a MWT silicon solar cell wafer.

EXAMPLES (1) Manufacture of Test Samples (i) Example Silver Pastes 1 to 3:

The compositions of the silver pastes 1 to 3 are displayed in Table 1. The pastes comprise of silver powder (average particle size 2 μm), organic vehicle (polymeric resins and organic solvents) and glass frit (average particle size 8 μm). Table 2 provides composition data of the glass frit type employed.

TABLE 1

| Silver | Composition (wt. %) | | |
|---|---|---|---|
| Paste | silver powder | organic vehicle | glass frit type |
| 1 | 85.0 | 14.5 | 0.5 of type 1 |
| 2 | 81.0 | 17.0 | 2.0 of type 1 |
| 3 | 86.0 | 9.3 | 4.7 of type 2 |

TABLE 2

| Glass type | Softening point temperature (° C.) | Glass components (wt. %) | | | | | | |
|---|---|---|---|---|---|---|---|---|
| | | $SiO_2$ | $Al_2O_3$ | $B_2O_3$ | PbO | $TiO_2$ | $ZrO_2$ | $Li_2O$ |
| 1 | 573 | 28 | 4.7 | 8.1 | 55.9 | 3.3 | — | — |
| 2 | 438 | 17.8 | 0.2 | 1.9 | 79.5 | — | 0.5 | 0.1 |

(ii) Formation of TLM Samples:

On the front face of Si substrates (200 μm thick multicrystalline silicon wafers of area 243 $cm^2$, n-type (phosphorus) bulk silicon, with a p-type diffused $BBr_3$ emitter, surface texturized with acid, 75 nm thick $SiN_x$ ARC layer on the wafer's emitter applied by CVD) the silver pastes 1-3 were screen-printed as 127 μm wide and 6 μm thick parallel finger lines having a distance of 2.2 mm between each other. The silver paste was dried before firing.

The printed wafers were then fired in a Despatch furnace at a belt speed of 3000 mm/min with zone temperatures defined as zone 1=500° C., zone 2=525° C., zone 3=550° C., zone 4=600° C., zone 5=925° C. and the final zone set at 890° C., thus the wafers reaching a peak temperature of 800° C.

To produce TLM samples, the fired wafers were subsequently laser scribed and fractured into 10 mm×28 mm TLM samples, where the parallel silver metallization lines did not touch each other. Laser scribing was performed using a 1064 nm infrared laser supplied by Optek.

(iii) Formation of Samples for Adhesion Measurements:

On the front face of non-passivated Si substrates (200 μm thick multicrystalline silicon wafers of area 243 $cm^2$, n-type (phosphorus) bulk silicon, with a p-type diffused $BBr_3$ emitter, surface texturized with acid) the silver pastes 1-3 were screen-printed and dried as 2 mm wide and 25 μm thick busbars.

The printed wafers were then fired in a Despatch furnace at a belt speed of 3000 mm/min with zone temperatures defined as zone 1=500° C., zone 2=525° C., zone 3=550° C., zone 4=600° C., zone 5=925° C. and the final zone set at 890° C., thus the wafers reaching a peak temperature of 800° C.

(2) Test Procedures and Results (i) TLM Measurement:

The TLM samples were measured by placing them into a GP 4-Test Pro instrument available from GP Solar for the purpose of measuring contact resistivity. The measurements were performed at 20° C. with the samples in darkness. The test probes of the apparatus made contact with 6 adjacent fine line silver electrodes of the TLM samples, and the contact resistivity ($\rho c$) was recorded.

(ii) Fired Adhesion Measurement:

For the adhesion test, a commercially available automated solder machine from Semtek (PV Soldering Machine, Model SCB-160) was employed. The solder process involved coating a solder ribbon (62Sn-36Pb-2Ag) with flux (Kester 952S) and applying the force of 10 heated pins to the coated solder ribbon and busbar to induce wetting of the fired silver surface on the silicon substrate, resulting in adhesion between the busbar and ribbon. The heated pins were set to a temperature of 260° C. and the soldering pre-heat plate where the sample of interest was placed was set to 180° C.

Adhesion was measured pulling on the solder ribbon at multiple points along the bus bar at speed of 100 mm/s and angle of 90°. The force to remove the busbar was measured in Newtons (N).

Table 3 presents the measured contact resistivity and average adhesion data.

TABLE 3

| Example | Silver paste | Contact Resistivity ($\Omega \cdot cm^2$) | Average Adhesion (N) |
|---|---|---|---|
| 1 (according to the invention) | 1 | >364 $\Omega \cdot cm^{2*)}$ | 5.1 ± 1.6 |
| 2 (according to the invention) | 2 | >364 $\Omega \cdot cm^{2*)}$ | 4.8 ± 1.1 |
| 3 (comparative example) | 3 | 1.9 m$\Omega \cdot cm^2$ | 3.1 ± 1.2 |

*)The contact resistivity exceeded the upper measurable limit for the GP 4-Test Pro equipment (>364 $\Omega \cdot cm^2$).

What is claimed is:

1. A process for the production of a metal wrap through silicon solar cell comprising the steps:
   (1) providing an n-type silicon wafer for the production of the metal wrap through silicon solar cell, wherein the n-type silicon wafer has (i) holes forming vias between the front-side and the back-side of the wafer and (ii) a p-type emitter extending over the entire front-side and the inside of the holes,
   (2) applying a conductive metal paste to the holes of the silicon wafer to provide at least the inside of the holes with a metallization,
   (3) drying the applied conductive metal paste, and
   (4) firing the dried conductive metal paste, whereby the wafer reaches a peak temperature of 700 to 900° C.,
   wherein the conductive metal paste has no or only poor fire-through capability and comprises (a) at least one particulate electrically conductive metal selected from the group consisting of silver, copper and nickel, (b) at least one particulate p-type dopant, and (c) an organic vehicle, wherein the at least one particulate p-type dopant is selected from the group consisting of boron, aluminum and p-type silicon alloys selected from the group consisting of alloys comprising silicon and boron, alloys comprising silicon and aluminum and alloys comprising silicon, boron and aluminum.

2. The process of claim 1, wherein the n-type silicon wafer has an ARC layer on its front-side that leaves out the inside of the holes.

3. The process of claim 1, wherein the organic vehicle content is from 10 to 45 wt. %, based on total conductive metal paste composition.

4. The process of claim 1, wherein the electrically conductive metal is present in the conductive metal paste in a proportion of 50 to 92 wt. %.

5. The process of claim 1, wherein the electrically conductive metal is silver.

6. The process of claim 1, wherein the conductive metal paste contains at least one other particulate metal selected from the group consisting of particulate iridium, particulate platinum and particulate palladium in a total proportion of 0.5 to 5 wt. %, based on the total of particulate metals contained in the conductive metal paste.

7. The process of claim 1, wherein the total content of the at least one p-type dopant in the conductive metal paste is 0.5 to 10 wt.-%.

8. The process of claim 1, wherein the p-type silicon alloy is eutectic aluminum/silicon alloy (AlSi12).

9. The process of claim 1, wherein the conductive metal paste comprises as component (d) at least one glass fit selected from the group consisting of (i) lead-free glass frits with a softening point temperature in the range of 550 to 611° C. and containing 11 to 33 wt. % of $SiO_2$, >0 to 7 wt. % of $Al_2O_3$ and 2 to 10 wt. % of $B_2O_3$ and (ii) lead-containing glass frits with a softening point temperature in the range of 571 to 636° C. and containing 53 to 57 wt. % of PbO, 25 to 29 wt. % of $SiO_2$, 2 to 6 wt. % of $Al_2O_3$ and 6 to 9 wt. % of $B_2O_3$.

10. The process of claim 9, wherein one or more of the lead-free glass frits contain 40 to 73 wt. % of $Bi_2O_3$.

11. The process of claim 9, wherein the total content of glass frit selected from the group consisting of types (i) and (ii) in the conductive metal paste is 0.25 to 8 wt. %.

12. The process of claim 1, wherein the conductive metal paste is applied as a conductive metal layer or as a conductive metal plug.

13. The process of claim 1, wherein the conductive metal paste is applied by printing.

14. The process of claim 1, wherein firing is performed as cofiring together with at least one metal paste selected from the group consisting of (1) a conductive metal paste that has been applied to the front-side to form a front-side metallization in the form of thin conductive metal collector lines arranged in a pattern typical for MWT silicon solar cells and (2) a back-side silver paste that has been applied to the back-side to form silver back collector contacts.

* * * * *